United States Patent
Cuchiaro et al.

(12)
(10) Patent No.: US 6,365,927 B1
(45) Date of Patent: Apr. 2, 2002

(54) FERROELECTRIC INTEGRATED CIRCUIT HAVING HYDROGEN BARRIER LAYER

(75) Inventors: Joseph D. Cuchiaro; Carlos A. Paz de Araujo; Larry D. McMillan, all of Colorado Springs, CO (US)

(73) Assignee: Symetrix Corporation, Colorado Springs, CO (US)

( * ) Notice: Subject to any disclaimer, the term of this patent is extended or adjusted under 35 U.S.C. 154(b) by 0 days.

(21) Appl. No.: 09/541,290

(22) Filed: Apr. 3, 2000

(Under 37 CFR 1.47)

(51) Int. Cl.[7] .................... H01L 29/76; H01L 29/94; H01L 31/062; H01L 31/113; H01L 31/119
(52) U.S. Cl. .......................... 257/295; 257/43
(58) Field of Search .................... 257/43, 295, 310, 257/350, 750, 751, 753, 760, 761, 762, 764, 765

(56) References Cited

U.S. PATENT DOCUMENTS

| 5,046,043 A | 9/1991 | Miller et al. |
| 5,434,102 A | 7/1995 | Watanabe et al. |
| 5,456,945 A | 10/1995 | McMillan et al. |
| 5,466,629 A * | 11/1995 | Mihara et al. ............... 257/310 |
| 5,468,684 A | 11/1995 | Yoshimori et al. |
| 5,481,490 A * | 1/1996 | Watanabe et al. ............ 365/145 |
| 5,519,234 A | 5/1996 | Paz de Araujo et al. |
| 5,523,595 A | 6/1996 | Takenaka et al. |
| 5,523,964 A | 6/1996 | McMillan et al. |
| 6,165,802 A * | 12/2000 | Cuchiaro et al. ............... 438/3 |
| 6,171,934 B1 * | 1/2001 | Joshi et al. ................. 438/469 |

* cited by examiner

Primary Examiner—David Nelms
Assistant Examiner—David Nhu
(74) Attorney, Agent, or Firm—Patton Boggs LLP (57) ABSTRACT

A hydrogen diffusion barrier in an integrated circuit is located to inhibit diffusion of hydrogen to a thin film of metal oxide material in an integrated circuit. The hydrogen diffusion barrier comprises at least one of the following nitrides: aluminum titanium nitride ($Al_2Ti_3N_6$), aluminum silicon nitride ($Al_2Si_3N_6$), aluminum niobium nitride ($AlNb_3N_6$), aluminum tantalum nitride ($AlTa_3N_6$), aluminum copper nitride ($Al_2Cu_3N_4$), tungsten nitride (WN), and copper nitride ($Cu_3N_2$). The thin film of metal oxide is ferroelectric or high-dielectric, nonferroelectric material. Preferably, the metal oxide comprises ferroelectric layered superlattice material. Preferably, the hydrogen barrier layer is located directly over the thin film of metal oxide.

21 Claims, 5 Drawing Sheets

FERROELECTRIC INTEGRATED CIRCUIT HAVING HYDROGEN BARRIER LAYER

BACKGROUND OF THE INVENTION

1. Field of the Invention

The invention relates to an integrated circuit having a hydrogen barrier layer to protect elements containing ferroelectric or high-dielectric constant metal oxide materials.

2. Description of the Related Art

Ferroelectric compounds possess favorable characteristics for use in nonvolatile integrated circuit memories. See Miller, U.S. Pat. No. 5,046,043. A ferroelectric device, such as a capacitor, is useful as a nonvolatile memory when it possess desired electronic characteristics, such as high residual polarization, good coercive field, high fatigue resistance, and low leakage current. Lead-containing $ABO_3$-type ferroelectric oxides such as PZT (lead titanate zirconate) and PLZT (lanthanum lead titanate zirconate) have been studied for practical use in integrated circuits. Layered superlattice material oxides have also been studied for use in integrated circuits. See Watanabe, U.S. Pat. No. 5,434,102. Layered superlattice material compounds exhibit characteristics in ferroelectric memories that are orders of magnitude superior to those of PZT and PLZT compounds. Integrated circuit devices containing ferroelectric elements are currently being manufactured. Nevertheless, the persistent problem of hydrogen degradation during the manufacturing process hinders the economical production in commercial quantities of ferroelectric memories and other IC devices using the layered superlattice material compounds with the desired electronic characteristics.

A typical ferroelectric memory device in an integrated circuit contains a semiconductor substrate and a metal-oxide semiconductor field-effect transistor (MOSFET) in electrical contact with a ferroelectric device, usually a ferroelectric capacitor. A ferroelectric capacitor typically contains a thin film containing ferroelectric metal oxide located between a first, bottom electrode and a second, top electrode, the electrodes typically containing platinum. During manufacture of the circuit, the MOSFET is subjected to conditions causing defects in the silicon substrate. For example, the CMOS/MOSFET manufacturing process usually includes high energy steps, such as ion-mill etching and plasma etching. Defects also arise during heat treatment for crystallization of the ferroelectric thin film at relatively high temperatures, often in the range 500° C. to 900° C. As a result, numerous defects are generated in the single crystal structure of the semiconductor silicon substrate, leading to deterioration in the electronic characteristics of the MOSFET.

To restore the silicon properties of the MOSFET/CMOS, the manufacturing process typically includes a hydrogen annealing step in which defects, such as dangling bonds, are eliminated by utilizing the reducing property of hydrogen. Various techniques have been developed to effect the hydrogen annealing, such as a forming gas anneal ("FGA"). Conventionally, FGA treatments are conducted under ambient conditions in a $H_2$—$N_2$ gas mixture between 350° C. and 550° C., typically around 400° C. to 450° C., for a time period of about 30 minutes. In addition, the CMOS/MOSFET manufacturing process requires other fabrication steps that expose the integrated circuit to hydrogen, often at elevated temperatures, such as hydrogen-rich plasma CVD processes for depositing metals and dielectrics, growth of silicon dioxide from silane or TEOS sources, and etching processes using hydrogen and hydrogen plasma. During processes that involve hydrogen, the hydrogen diffuses principally through the top electrode to the ferroelectric thin film, but also from the side edges of the capacitor, and reduces the oxides contained in the ferroelectric material. The absorbed hydrogen also metallizes the surface of the ferroelectric thin film by reducing metal oxides. As a result of these effects, the electronic properties of the capacitor are degraded. After the forming-gas anneal (FGA), the remnant polarization of the ferroelectrics is very low and no longer suitable for storing information. An increase in leakage currents also results. In addition, the adhesivity of the ferroelectric thin film to the upper electrode is lowered by the chemical change taking place at the interface. Alternatively, the upper electrode is pushed up by the oxygen gas, water, and other products of the oxidation-reduction reactions taking place. Thus, peeling is likely to take place at the interface between the top electrode and the ferroelectric thin film. In addition, hydrogen also can reach the lower electrode, leading to internal stresses that cause the capacitor to peel off its substrate. These problems are acute in ferroelectric memories containing layered superlattice material compounds because these oxide compounds are particularly complex and prone to degradation by hydrogen-reduction.

A related problem encountered in the fabrication of ferroelectric devices is the stress arising in and between the different circuit layers as a result of the manufacturing processes. The ferroelectric compounds comprise metal oxides. The products of the hydrogen reduction reactions cause an increase in the total volume of the ferroelectric element. As a result, the ferroelectric thin film exerts an upward pressure on the layers above it.

Several methods have been reported in the art to inhibit or reverse hydrogen degradation of desired electronic properties in ferroelectric oxide materials. Oxygen-recovery annealing at high temperature (800° C.) for about one hour results in virtually complete recovery of the ferroelectric properties degraded by hydrogen treatments; but the high-temperature oxygen-anneal itself may generate defects in silicon crystalline structure, and it may offset somewhat the positive effects of any prior forming-gas anneal on the CMOS characteristics. Also, if hydrogen reactions have caused structural damage to the ferroelectric device, such as peeling, then a recovery anneal is not able to reverse effectively the damage.

To reduce the detrimental effects of the hydrogen heat treatment and protect the ferroelectric metal oxide element, the prior art also teaches the application of hydrogen barrier layers to inhibit the diffusion of hydrogen into the ferroelectric material. The barrier layer is typically located over the ferroelectric element, but it can also be located below and laterally to the sides of the element.

Hydrogen degradation is also a problem in complex metal oxides used in nonferroelectric, high-dielectric constant applications in integrated circuits. Hydrogen reactions cause structural damage, as described above for ferroelectric oxides, and cause degradation of dielectric properties. Examples of metal oxides subject to hydrogen degradation include barium strontium titanate ("BST"), barium strontium niobate ("BSN"), certain $ABO_3$-type perovskites, and certain layered superlattice materials. Hydrogen barrier layers are, therefore, used also to protect nonferroelectric, high-dielectric constant metal oxides.

It is known in the art to use a hydrogen barrier layer comprising a nitride of aluminum, silicon or titanium, that is, AlN, $Si_3N_4$, or $Ti_3N_4$.

Typically, hydrogen barrier layers known in the art are not completely effective in preventing hydrogen diffusion and the resulting hydrogen degradation of metal oxides. Thus, even when a diffusion barrier is used, it is not uncommon for structural damage to arise in the ferroelectric or dielectric device and for hydrogen to reach the metal oxide layer and degrade the desired ferroelectric or dielectric properties of the metal oxide material. Therefore, it would be useful to have new materials different from those known in the art to obtain the benefits of a hydrogen barrier layer in protecting ferroelectric and dielectric oxide materials, in particular, ferroelectric layered superlattice materials, from hydrogen degradation.

BRIEF SUMMARY OF THE INVENTION

The invention solves the above problem by disclosing novel compositions of material for a hydrogen diffusion barrier.

A feature of the invention is a hydrogen barrier layer comprising a nitride of aluminum and another chemical element selected from the group consisting of silicon, titanium, tantalum, niobium, copper and tungsten. Such nitrides include: aluminum titanium nitride ($Al_2Ti_3N_6$), aluminum silicon nitride ($Al_2Si_3N_6$), aluminum niobium nitride ($AlNb_3N_6$), aluminum tantalum nitride ($AlTa_3N_6$), aluminum copper nitride ($Al_2Cu_3N_4$). Another feature of the invention is a hydrogen barrier layer comprising a nitride of copper or tungsten. Such nitrides include tungsten nitride (WN) and copper nitride ($CU_3N_2$).

Another feature of the invention is an integrated circuit in which a hydrogen barrier layer as described above is located to inhibit diffusion of hydrogen to a thin film of metal oxide material. Preferably, the inventive hydrogen barrier layer is located directly over the thin film of metal oxide material, but it may also be located below or laterally to the sides of the thin film. The metal oxide material may be ferroelectric material, or it may be nonferroelectric, high-dielectric constant material. The composition of a thin film of ferroelectric material may be selected from a group of suitable ferroelectric oxide materials, including but not limited to: an $ABO_3$-type perovskite, such as a titanate (e.g., $BaTiO_3$, $SrTiO_3$, $PbTiO_3$, $PbZrTiO_3$), a niobate (e.g., $KNbO_3$), and, preferably, a layered superlattice compound. Alternatively, a thin film of nonferroelectric, high-dielectric constant materials may be selected from a group including but not limited to: barium strontium titanate ("BST"), barium strontium niobate ("BSN"), certain $ABO_3$-type perovskites, and certain layered superlattice materials.

Numerous other features, objects and advantages of the invention will become apparent from the following description when read in conjunction with the accompanying drawings.

DETAILED DESCRIPTION OF THE PREFERRED EMBODIMENT

1. Overview and Description of Integrated Circuit

It should be understood that FIGS. 1–4 depicting ferroelectric integrated circuit devices are not meant to be actual plan or cross-sectional views of any particular portions of actual integrated circuit devices. In actual devices, the layers will not be as regular and the thicknesses may have different proportions. The various layers in actual devices often are curved and possess overlapping edges. The figures instead show idealized representations that are employed to depict more clearly and fully the structure of the invention than would otherwise be possible. Also, the figures represent only several of innumerable variations of ferroelectric devices that could be fabricated using the method of the invention. FIGS. 1–4 depict ferroelectric memories containing a switch in the form of a field effect transistor in electrical connection with a ferroelectric capacitor; but the hydrogen barrier layer of this invention can also be used in a ferroelectric FET memory in which the ferroelectric element is incorporated in the switch element. Such a ferroelectric FET was described in McMillan, U.S. Pat. No. 5,523,964 issued Jun. 4, 1996 and in U.S. patent application Ser. No. 09/329,670 filed Jun. 10, 1999 by Lim et al., which patent and patent application are hereby incorporated by reference as though fully disclosed herein. Likewise, other integrated circuits fabricated using the unique hydrogen barrier layers of the invention could include other elements and compositions of material. For example, although this description of the invention focuses on a hydrogen barrier layer used to protect a ferroelectric nonvolatile memory, the invention is useful to protect integrated circuit devices containing nonferroelectric metal oxide materials against hydrogen damage.

For the sake of clarity, structural elements of the embodiments depicted in FIGS. 1–4 that are virtually identical from one embodiment to the next are identified with the same reference numerals in different figures.

Figure 1:
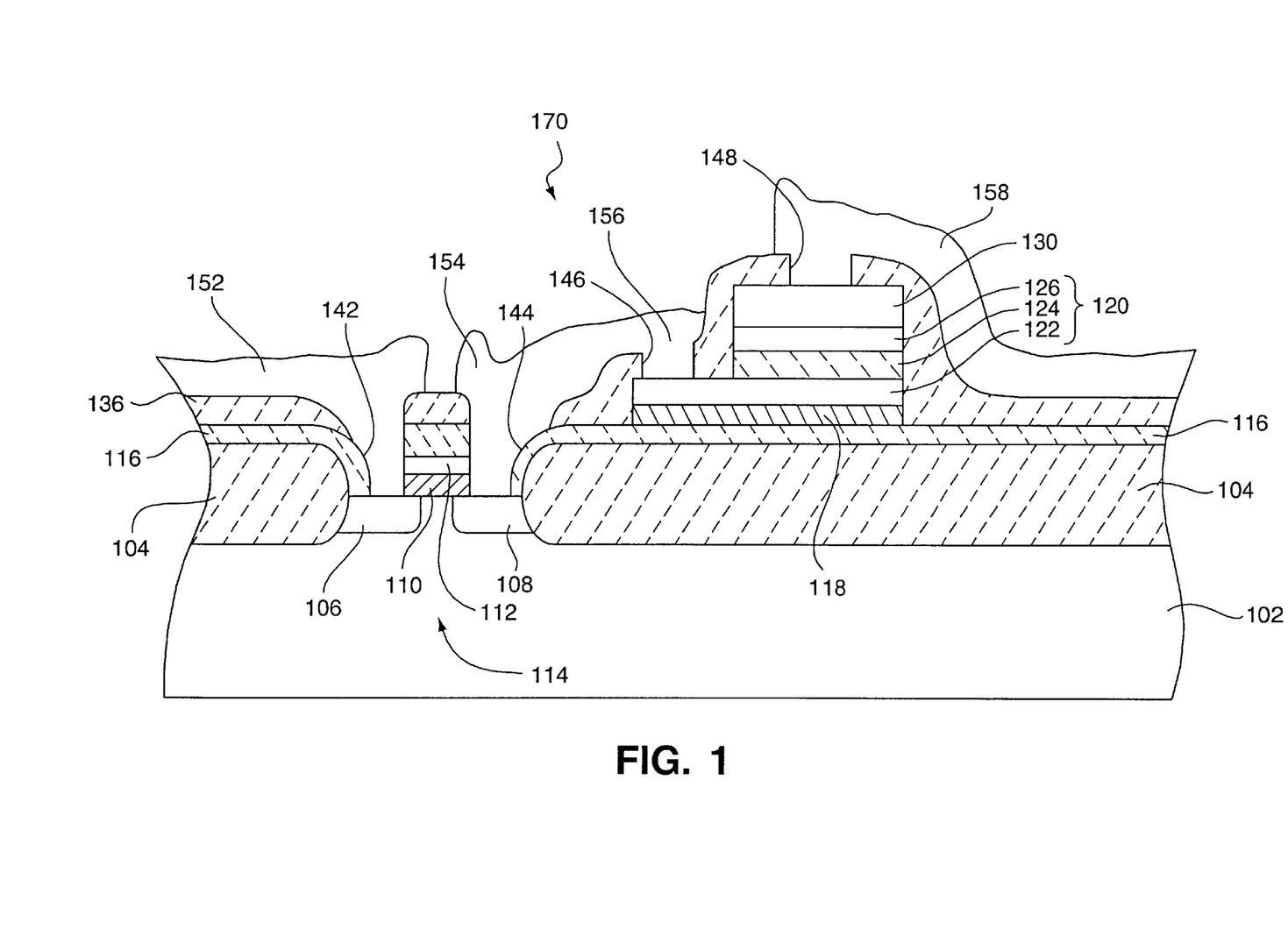
FIG. 1 is a cross-sectional view of an integrated circuit in accordance with the invention in which a stacked nonvolatile capacitor is capped by a hydrogen barrier layer.

In FIG. 1, there is shown a cross-sectional view of an exemplary nonvolatile ferroelectric memory cell 170 that could be fabricated according to the invention. The general manufacturing steps for fabricating integrated circuits containing MOSFETs and ferroelectric capacitor elements are described in Mihara, U.S. Pat. No. 5,466,629, and Yoshimori, U.S. Pat. No. 5,468,684, which are hereby incorporated by reference as if fully disclosed herein. General fabrication methods have been described in other references also. Therefore, the elements of the circuit of FIG. 1 will be simply identified here.

In FIG. 1, a field oxide region 104 is formed on a surface of a silicon substrate 102. A source region 106 and a drain region 108 are formed separately from each other within silicon substrate 102. A gate insulating layer 110 is formed on silicon substrate 102 between source region 106 and drain region 108. Further, a gate electrode 112 is formed on the gate insulating layer 110. These source region 106, drain region 108, gate insulating layer 110 and gate electrode 112 together form a MOSFET 114.

A first interlayer dielectric layer (ILD) 116 made of BPSG (boron-doped phosphosilicate glass) is formed on silicon substrate 102 and field oxide region 104. An adhesion layer 118 is formed on ILD 116. Adhesion layer 118 is made of, for example, titanium, and typically has a thickness of 20 nm. Adhesion layers, such as titanium, enhance the adhesion of the electrodes to adjacent underlying or overlying layers of the circuits.

As depicted in FIG. 1, a bottom electrode layer 122 made of platinum and having a thickness of 200 nm is deposited on adhesion layer 118. Then a ferroelectric thin film 124 is formed on bottom electrode layer 122. A top electrode layer 126, made of platinum and having a thickness of 200 nm, is formed on ferroelectric thin film 124. Electrode layers 122 and 126 together with ferroelectric thin film 124 form capacitor 120. The composition of ferroelectric thin film 124 is discussed in more detail below.

An electrically-conductive hydrogen barrier layer 130 is deposited on top electrode layer 126. Hydrogen barrier layer 130 has a thickness in the range 500 nm to 400 nm, preferably in the range of 100 nm to 200 nm. In accordance with the invention, hydrogen barrier layer 130 comprises at least one of the following nitrides: aluminum titanium nitride ($Al_2Ti_3N_6$), aluminum silicon nitride ($Al_2Si_3N_6$), aluminum niobium nitride ($AlNb_3N_6$), aluminum tantalum nitride ($AlTa_3N_6$), aluminum copper nitride ($Al_2Cu_3N_4$), tungsten nitride (WN), and copper nitride ($Cu_3N_2$). Layers 118, 122, 124, 126 and 130 are patterned, in as few as two patterning process steps, to form stacked capacitor 120 with self-aligned hydrogen barrier layer 130.

A second interlayer dielectric layer (ILD) 136 made of NSG (nondoped silicate glass) is deposited to cover ILD 116, ferroelectric capacitor 120 and hydrogen barrier layer 130. A PSG (phospho-silicate glass) film or a BPSG film could also be used in layer 136.

ILD 136 is patterned to form wiring holes for electrical contacts to MOSFET 114 and ferroelectric capacitor 120. Wiring hole 142 is selectively opened through ILD 136 and ILD 116 to expose source region 106, and wiring hole 144 is selectively opened through ILD 136 and ILD 116 to expose drain region 108. Wiring hole 146 is selectively opened through ILD 136 to expose a portion of bottom electrode 122. Wiring hole 148 is selectively opened through ILD 136 to expose hydrogen barrier layer 130.

Source electrode wiring 152 and drain electrode wiring 154 are formed to fill wiring holes 142 and 144, respectively. Bottom electrode wiring 156 and top electrode wiring 158 are formed to fill wiring holes 146 and 148, respectively. Drain electrode wiring 154 is electrically connected to bottom electrode wiring 156, and preferably is the same wiring element. Each of these wirings 152, 154, 156 and 158 preferably comprises Al—Si with a thickness of about 300 nm.

Figure 2:
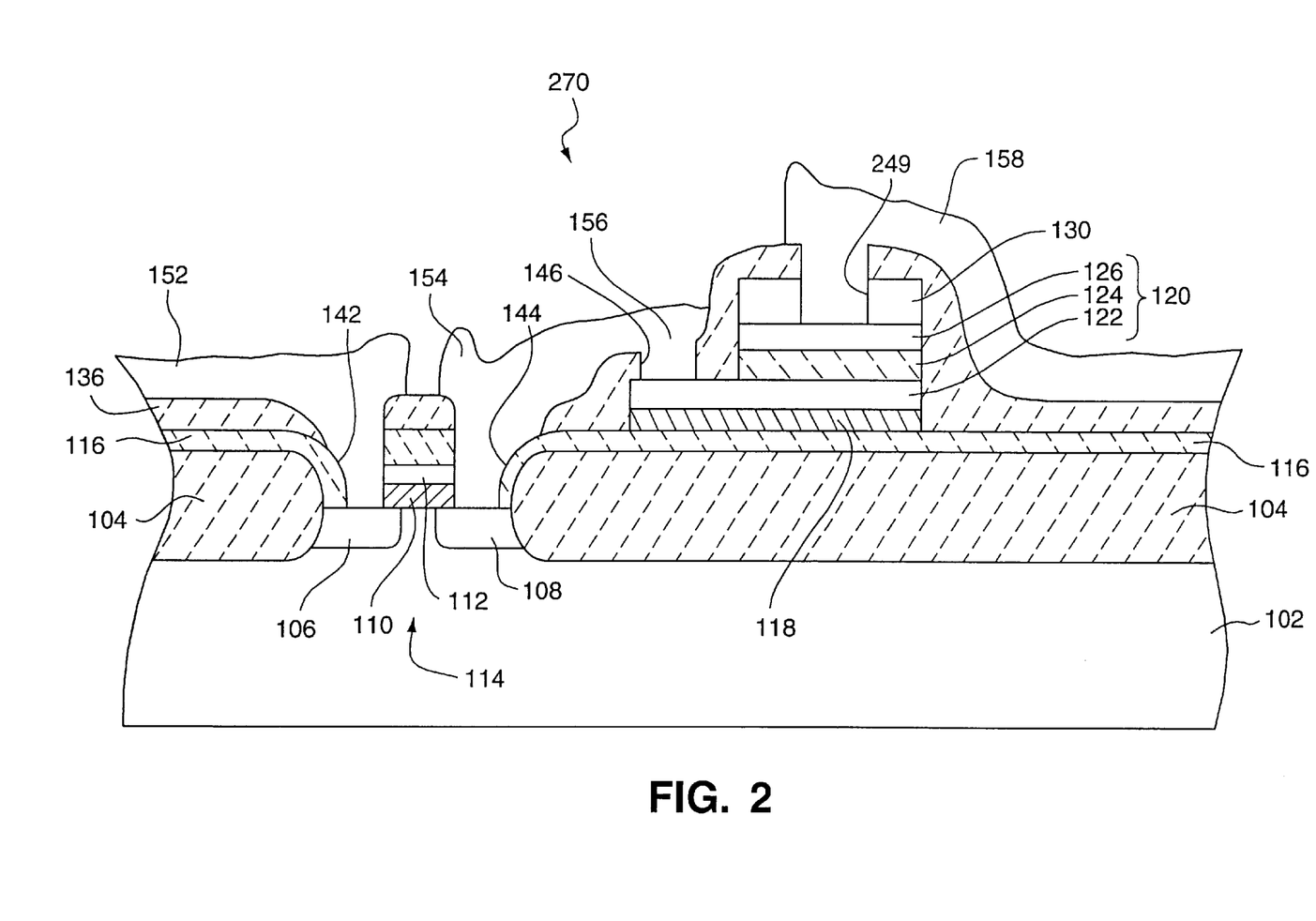
FIG. 2 depicts an alternative embodiment of the invention in which there is a wiring hole through the top ILD and the hydrogen barrier layer to provide direct electrical contact of the wiring layer to the top electrode.

To enhance electrical contact of circuit wiring to the top electrode, in an alternative embodiment of the invention, depicted in FIG. 2, a wiring hole 149 is made through ILD 136 and hydrogen barrier layer 130 to provide direct electrical contact of wiring layer 158 to top electrode 126.

Fabrication of the ferroelectric element, for example, the capacitor in FIG. 1, conventionally involves steps with oxidizing conditions that may damage switch 114 and other elements of the integrated circuit. After the ferroelectric element has been formed, a hydrogen heat treatment of the circuit is usually performed to repair oxidation damage of the switch. During this hydrogen treatment, as well as during other high-energy steps, the ferroelectric properties of ferroelectric thin film 124 are prone to degrade because hydrogen can diffuse into ferroelectric thin film 124 and react there with the ferroelectric oxides of ferroelectric thin film 124. Generally, hydrogen diffusion barriers according to the invention located directly over a ferroelectric element can inhibit hydrogen diffusion and thereby inhibit hydrogen degradation of the ferroelectric oxides.

The word "substrate" can mean the underlying wafer on which the integrated circuit is formed, such as silicon substrate 102. It may also mean any object or surface on which a material layer is directly deposited, such as BPSG layer 116. In this disclosure, "substrate" shall mean the object or surface to which the layer of interest is applied; for example, when we are talking about a bottom electrode, such as 122, the substrate on which it is deposited includes layers 118 and 116, on which electrode 122 is formed.

The terms "above", "top", "upper", "below", "bottom" and "lower" herein mean relative to silicon substrate 102. That is, if a second element is "above" a first element, it means it is farther from substrate 102; and if it is "below" another element, then it is closer to substrate 102 than the other element. The long dimension of substrate 102 defines a plane that is considered to be a "horizontal" plane herein, and directions perpendicular to this plane are considered to be "vertical".

A ferroelectric element typically comprises a relatively flat thin film of ferroelectric material. The terms "lateral" or "laterally" refer to the direction of the flat plane of the thin film. In FIG. 1, the lateral direction would be the horizontal direction.

This specification refers to a hydrogen barrier layer being formed directly over a thin film of ferroelectric material. By "directly over" is meant that the barrier layer is above at least a portion of the ferroelectric thin film in the vertical direction in FIGS. 1–4. For example, in FIG. 1, hydrogen barrier layer 130 is directly over ferroelectric thin film 124; it is also directly over bottom electrode layer 122, even though it is not above the portion of bottom electrode 122 in contact with wiring layer 156. The term "directly over" does not mean that the barrier layer is in direct contact with the ferroelectric layer. The barrier layer may or may not contact the ferroelectric layer. As long as it is directly over a portion of the ferroelectric layer, it will protect that portion from hydrogen diffusion. It is clear that ferroelectric elements can be fabricated with varying orientations relative to the horizontal and vertical. For example, if the ferroelectric thin film is in the vertical plane, then the word "lateral" would refer to the vertical direction, and "directly over" would refer to an orientation normal to the vertical plane of the thin film. The term "on" is often used in the specification when referring to the deposition or formation of an integrated circuit layer onto an underlying substrate or layer. In contrast to "directly over", the term "on" generally signifies direct contact, as is clear in the various contexts in which it is used.

Figure 3:
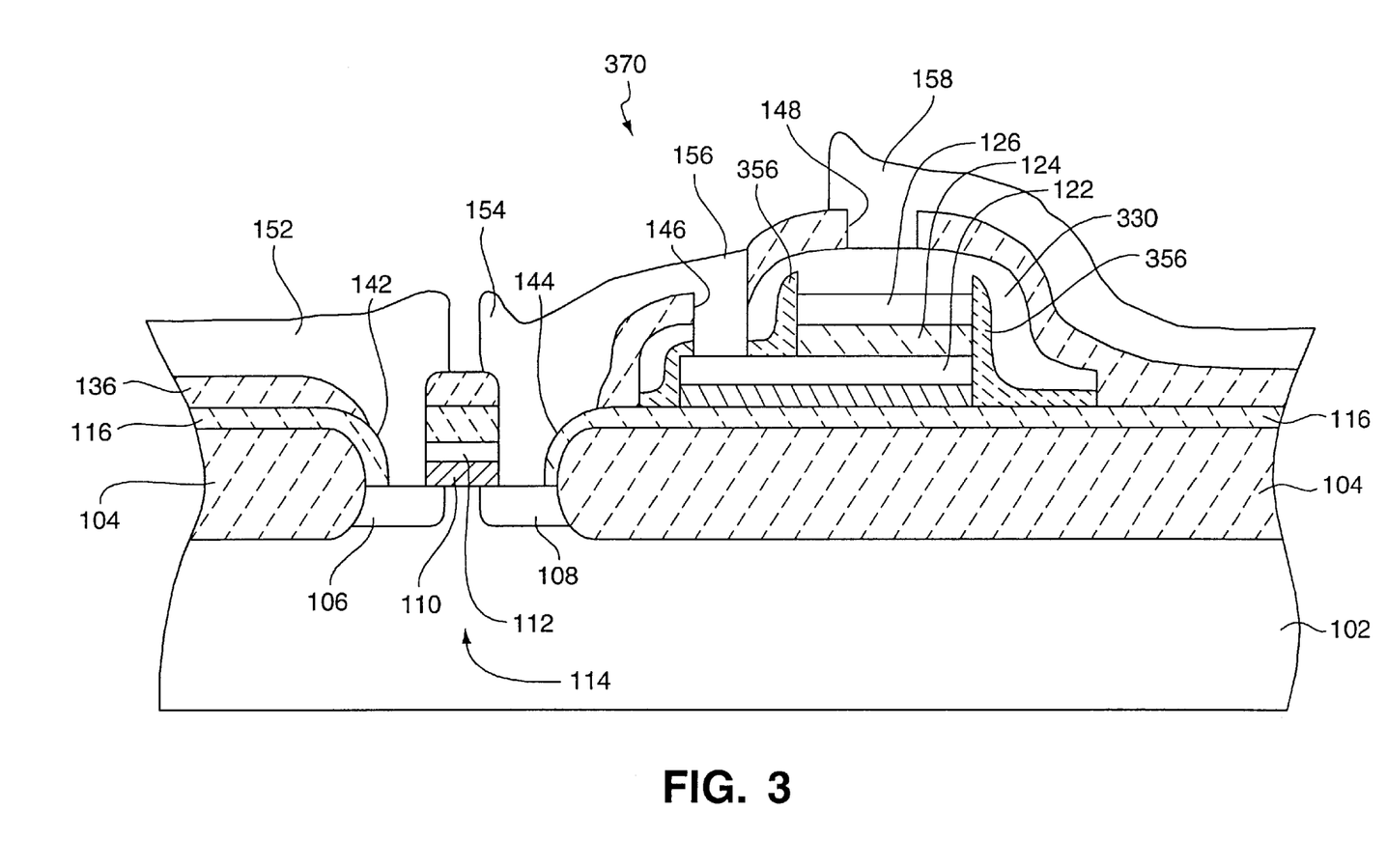
FIG. 3 depicts an alternative embodiment in which the hydrogen barrier layer covers both the top and the sides of the memory capacitor.
Figure 4:
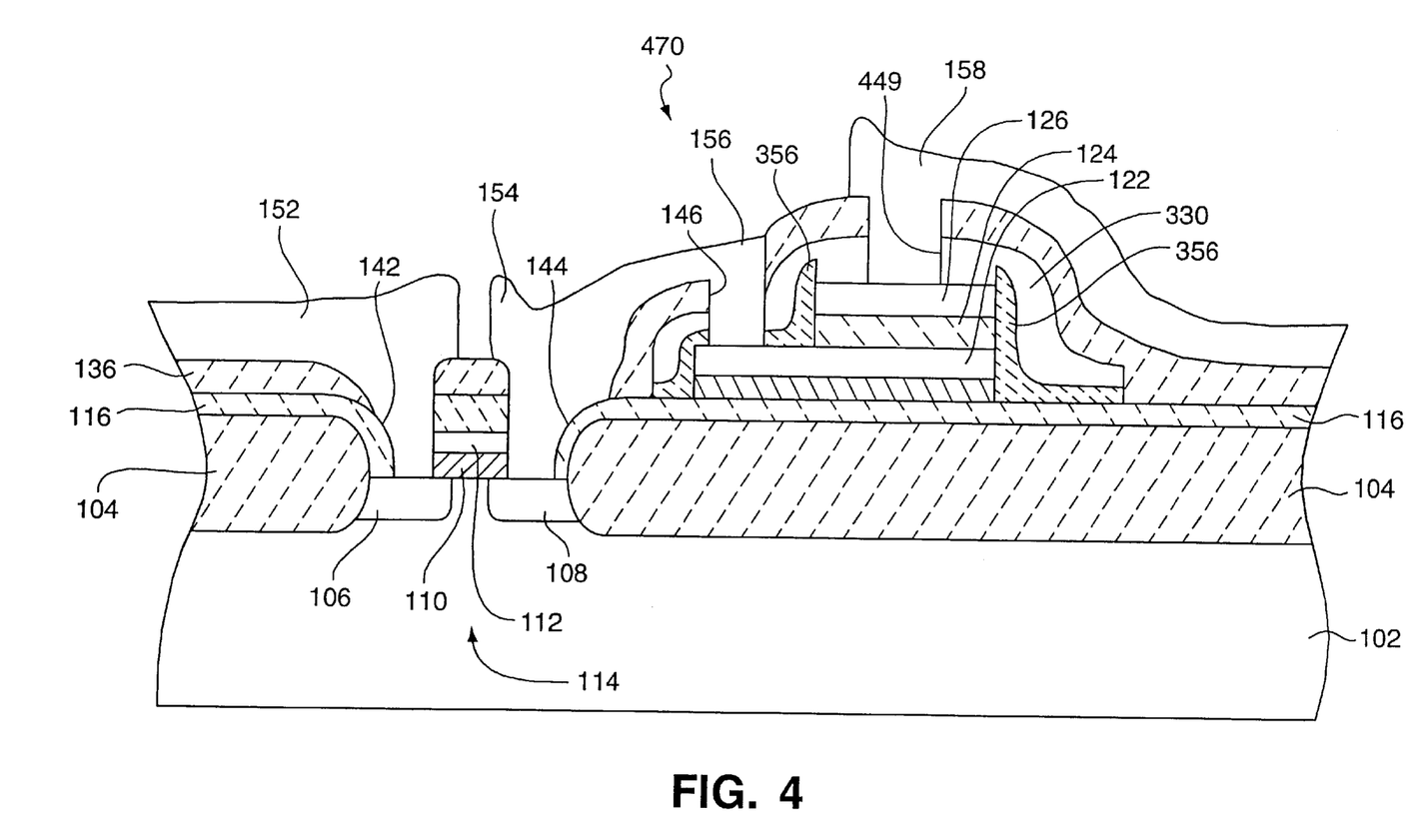
FIG. 4 depicts a modification of the embodiment of FIG. 3 in which there is a wiring hole through the top ILD and the hydrogen barrier layer to provide direct electrical contact of the wiring layer to the top electrode.

In the preferred embodiment of the invention, as depicted in FIG. 1, the hydrogen barrier layer is located above top electrode layer 126, directly over ferroelectric thin film 124. As depicted in FIG. 3, though, it is also useful when the hydrogen barrier layer 330 in an alternative embodiment of the invention is located laterally from ferroelectric thin film 124 to cover the sides of capacitor 120 and thereby inhibit diffusion of hydrogen laterally into thin film 124. Since the compositions of the hydrogen barrier layer according to the invention are relatively electrically conductive, the hydrogen barrier layer typically is not in direct contact with the sides of capacitor 120; rather, it is separated by an insulating layer 356 from capacitor 120. FIG. 4 depicts a modification of the embodiment of FIG. 3 in which wiring hole 449 is made through ILD 136 and hydrogen barrier layer 330 to provide direct electrical contact of wiring layer 158 to top electrode 126.

The term "thin film" is used herein as it is used in the integrated circuit art. Generally, it means a film of less than a micron in thickness. The thin films disclosed herein are in all instances less than 0.5 microns in thickness. Preferably, ferroelectric thin films 124 are 100 nm to 300 nm thick, and most preferably 120 nm to 250 nm thick. These thin films of the integrated circuit art should not be confused with the layered capacitors of the macroscopic capacitor art which are formed by a wholly different process which is incompatible with the integrated circuit art.

The composition of ferroelectric thin film 124 can be selected from a group of suitable ferroelectric oxide materials, including but not limited to: an $ABO_3$-type perovskite, such as a titanate (e.g., $BaTiO_3$, $SrTiO_3$, $PbTiO_3$, $PbZrTiO_3$), a niobate (e.g., $KNbO_3$), and, preferably, a layered superlattice compound. Alternatively, thin film 124 may comprise nonferroelectric metal oxides, such as high-dielectric constant materials used in DRAM cells, selected from a group including but not limited to: barium strontium titanate ("BST"), barium strontium niobate ("BSN"), certain $ABO_3$-type perovskites, and certain layered superlattice materials.

U.S. Pat. No. 5,519,234 issued May 21, 1996, incorporated herein by reference, discloses that layered superlattice compounds, such as strontium bismuth tantalate, have excellent properties in ferroelectric applications as compared to the best prior materials, and have high dielectric constants and low leakage currents. U.S. Pat. No. 5,434,102 issued Jul. 18, 1995 and U.S. Pat No. 5,468,684 issued Nov. 21, 1995, incorporated herein by reference, describe processes for integrating these materials into practical integrated circuits.

The layered superlattice materials may be summarized generally under the formula:

$$A1_{w1}^{+a1}A2_{w2}^{+a2}\ldots Aj_{wj}^{+aj}S1_{x1}^{+s1}S2_{x2}^{+s2}\ldots SK_{xk}^{+sk}B1_{y1}^{+b1}B2_{y2}^{+b2}\ldots Bl_{yl}^{+bl}Q_z^{-q}, \quad (1)$$

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements; for example, if Q is oxygen, then q=2. The subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary uniformly throughout the material; for example, in $Sr_{0.75}Ba_{0.25}Bi_2Ta_2O_9$, 75% of the A-sites are occupied by strontium atoms, and 25% of the A-sites are occupied by barium atoms. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include cases where either of the sites and the superlattice generator can have multiple elements. The value of z is found from the equation:

$$(a1w1+a2w2\ldots +ajwj)+(s1x1+s2x2\ldots +skxk)+(b1y1+b2y2\ldots +blyl)=qz. \quad (2)$$

Formula (1) includes all three of the Smolenskii type compounds discussed in U.S. Pat. No. 5,519,234 issued May 21, 1996, which is hereby incorporated by reference as though fully incorporated herein. The layered superlattice materials do not include every material that can be fit into Formula (1), but only those which spontaneously form themselves into crystalline structures with distinct alternating layers.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced stoichiometric" chemical formula is one in which the relative molar proportions of the elements correspond to a particular type of molecular or crystalline compound. In a balanced stoichiometric formula for a solid crystalline compound, there is just enough of each element to form a complete crystal structure of the material with all sites of the crystal lattice occupied; though, in actual practice, there always will be some defects in the crystal at room temperature. For example, both $SrBi_2(TaNb)O_9$ and $SrBi_2(Ta_{1.44}Nb_{0.56})O_9$ are balanced stoichiometric formulae. In contrast, a precursor for strontium bismuth tantalum niobate in which the molar proportions of strontium, bismuth, tantalum, and niobium are 1, 2.18, 1.44, and 0.56, respectively, is represented herein by the "unbalanced stoichiometric" formula $SrBi_{2.18}(Ta_{1.44}Nb_{0.56})O_9$, since it contains excess bismuth beyond what is needed to form a complete crystalline material. The general term "stoichiometric", therefore, may refer to either a balanced or an unbalanced stoichiometric formula. In this disclosure, an "excess" amount of a metallic element means an amount greater than required to bond with the other metals present to make the desired material, with all atomic sites occupied and no amount of any metal left over.

It is known in the art that a layered superlattice material made from a precursor with an amount of superlattice generator element or B-site element in excess of the stoichiometrically balanced amount is more resistant to degradation by hydrogen than material made from a precursor containing amounts of metal corresponding to a balanced stoichiometric formula. For example, amounts in the precursor of at least one metal, such as bismuth and niobium, above or in addition to that present in a balanced formula, inhibit hydrogen degradation.

It is also known in the art that ferroelectric nonvolatile memories possessing good electronic properties are fabricated by forming a thin film of strontium bismuth tantalate material comprising chemical elements in proportions approximately represented by the stoichiometric formula $SrBi_2Ta_2O_9$. Based on the Watanabe et al. U.S. Pat. No. 5,434,102 patent and related work, the precursor for making layered superlattice materials currently preferred by those skilled in the art has the stoichiometric formula $SrBi_{2.18}Ta_{1.44}Nb_{0.56}O_9$.

Detailed Description of the Fabrication Process

Figure 5:
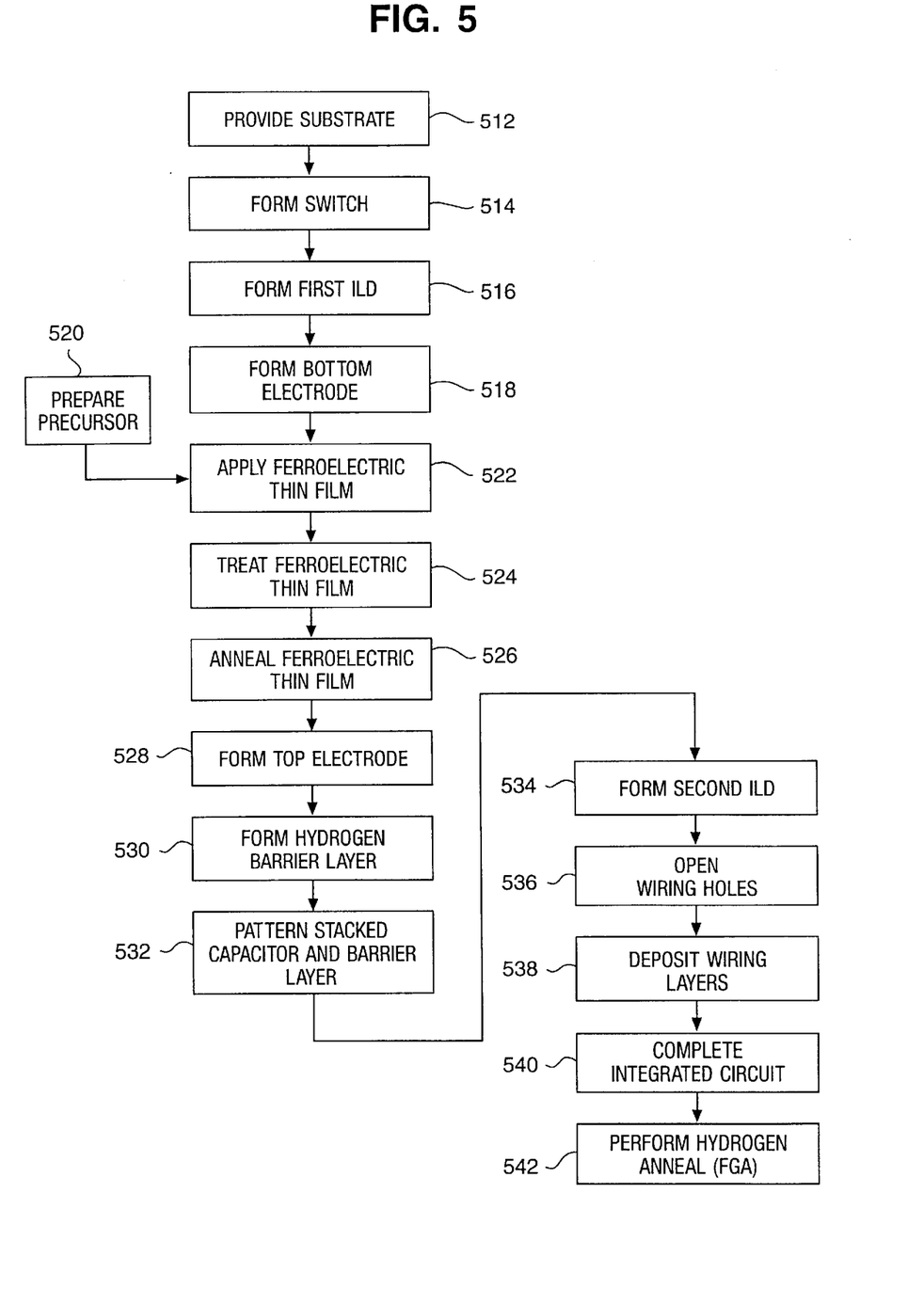
FIG. 5 is a flow chart showing a process flowsheet for fabricating a nonvolatile ferroelectric memory device containing a hydrogen barrier layer in a preferred embodiment of the invention.

The diagram of FIG. 5 is a flow sheet of the fabrication steps to make a ferroelectric memory 170 incorporating a hydrogen barrier layer 130 in a preferred embodiment of the invention, according to FIG. 1. Ferroelectric memory 170 is preferably formed on a conventional wafer that may be silicon, gallium arsenide or other semiconductor, or an insulator, such as glass or magnesium oxide (MgO). In step 512, a semiconductor substrate 102 (FIG. 1) is provided on which a switch 114 is formed in step 514. The switch is typically a MOSFET. In step 516, a first interlayer dielectric layer 116 is formed to separate the switching element from the ferroelectric element to be formed. In step 518, a bottom electrode layer 122 is formed. Preferably, electrode layer 122 is made of platinum and is sputter-deposited to form a layer with a thickness of about 200 nm. In the preferred method, an adhesion layer 118 made of titanium or titanium nitride of about 20 nm would be formed in this step, preferably by sputtering, prior to depositing the electrode. In step 520, chemical precursors of the desired ferroelectric thin film are prepared. Preferably, the precursors contain compounds for forming ferroelectric layered superlattice materials having the stoichiometric formula $SrBi_{2.18}Ta_{1.44}Nb_{0.56}O_9$. Ferroelectric thin film 124 is applied to bottom electrode layer 122 in step 522. A MOCVD method is the most preferred method to form the thin film. The ferroelectric thin films also can be applied using a liquid deposition technique, such as a spin-coating or a misted deposition method as described in U.S. Pat. No. 5,456,945. Usually, a final precursor solution is prepared from commercially available solutions containing the chemical precursor compounds. Preferably, the concentrations of the various precursors supplied in the commercial solutions are adjusted in step 520 to accommodate particular manufacturing or operating conditions. For example, the stoichiometric amounts of the various elements in a typical commercial solution for a layered superlattice thin film might be $SrBi_{2.18}Ta_{1.44}Nb_{0.56}O_9$. It is often desirable, however, to add excess niobium or bismuth to this solution to generate extra oxides that will protect the ferroelectric compounds from hydrogen degradation during reducing conditions. Application step 522 is preferably followed by a treatment process 524 which preferably includes a drying step and crystallization substeps at elevated temperatures, such as an oxygen furnace anneal and a rapid thermal process (RTP) anneal; treatment step 524 may include treatment with ultraviolet radiation during or after application step 522. Steps 522 and 524 may be repeated as necessary to form a film of the desired thickness. For example, in a typical spin-on procedure, a coat of the precursor might be applied and dried. Then another precursor coat might be applied and dried. The treated film is then annealed in oxygen to form the resulting ferroelectric thin film 124 in step 526. Following steps 522–526, top electrode layer 126 is formed in step 528. Preferably, top electrode layer 126 is made of platinum and is sputter-deposited to form a layer with a thickness of about 200 nm. In step 530, hydrogen barrier layer 130 is deposited. Preferably, hydrogen barrier layer 130 comprises at least one of the following nitrides: aluminum titanium nitride ($Al_2Ti_3N_6$), aluminum silicon nitride ($Al_2Si_3N_6$), aluminum niobium nitride ($AlNb_3N_6$), aluminum tantalum nitride ($AlTa_3N_6$), aluminum copper nitride ($Al_2Cu_3N_4$), tungsten nitride (WN), and copper nitride ($Cu_3N_2$). Preferably, hydrogen barrier layer 130 is deposited on top electrode layer 126 by a sputtering process. Preferably, it has a thickness of about 150 nm.

Patterning steps via processes such as ion milling and ashing, as known in the art, are also included as appropriate in the fabrication of ferroelectric memory cell 170. For example, step 518 may include such a patterning step, and another such patterning step may follow step 526. Preferably, however, a plurality of layers are patterned in a single patterning step, such as in step 532. Barrier layer formation step 530 is preferably followed by a patterning process 532 in which the stacked layers 118, 122, 124, 126 and 130 are patterned to form ferroelectric capacitor 120, covered by self-aligning hydrogen barrier layer 130. Preferably, only two etching processes are required to complete the patterning process of step 532. Preferably, a conventional ion milling process is utilized in steps 532. A second ILD layer 136 is then deposited in step 534 to cover ILD 116 and capacitor 120, including hydrogen barrier layer 130. In step 536, wiring holes 142, 144, 146, and 148 are made through ILD layers 116 and 136, as depicted in FIG. 1, to switch 114 (typically to the source and drain regions of a MOSFET), to bottom electrode 122, and to hydrogen barrier layer 130, respectively. Preferably, step 536 is performed using a standard ion milling process. In step 538, wiring layers 152, 154, 156, and 158 are deposited, as depicted in FIG. 1, preferably using a sputtering process. However, CVD processes can also be used, despite their accompanying reducing conditions, because hydrogen barrier layer 130 protects the ferroelectric oxides of thin film 124.

The circuit is completed in step 540, which typically includes deposition of a passivation layer. Finally, hydrogen annealing is performed in step 542 to repair defects and restore desired semiconductor properties in switch (MOSFET) 114. Preferably, the hydrogen anneal (FGA) of the integrated circuit is conducted at atmospheric pressure in a $H_2$—$N_2$ (forming gas) gas mixture with 1% to 5% $H_2$, at a temperature of between 200° C. and 400° C. for a time duration of from 10 to 40 minutes.

There has been described new compositions of hydrogen barrier layers for protecting both ferroelectric and nonferroelectric, high-dielectric constant metal oxide materials in integrated circuits against hydrogen degradation. In particular, there has been described a method and structure for fabricating a ferroelectric integrated circuit that permits exposure to hydrogen and still results in devices with good electronic properties. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. It is also evident that the steps recited may in some instances be performed in a different order, or equivalent structures and processes may be substituted for the various structures and processes described. Consequently, the invention is to be construed as embracing each and every novel feature and novel combination of features present in and/or possessed by the disclosed compositions and their use in fabrication processes, electronic devices, and electronic device manufacturing methods described.

We claim:

1. An integrated circuit comprising:
  a thin film of metal oxide material; and
  a hydrogen barrier layer, said hydrogen barrier layer located to inhibit the diffusion of hydrogen to said thin film of metal oxide material, and said hydrogen barrier layer comprising a nitride of aluminum and another chemical element selected from the group consisting of silicon, titanium, tantalum, niobium, copper and tungsten.

2. An integrated circuit as in claim 1 wherein said hydrogen barrier layer is located directly over at least a portion of said thin film of metal oxide material.

3. An integrated circuit as in claim 1 wherein said hydrogen barrier layer is located laterally from said thin film of metal oxide material.

4. An integrated circuit as in claim 1 wherein said metal oxide material comprises nonferroelectric, high-dielectric constant material.

5. An integrated circuit as in claim 4 wherein said nonferroelectric, high-dielectric constant material comprises a layered superlattice material.

6. An integrated circuit as in claim 1 wherein said metal oxide material comprises ferroelectric material.

7. An integrated circuit as in claim 6 wherein said ferroelectric material comprises a layered superlattice material.

8. An integrated circuit as in claim 7 wherein said layered superlattice material comprises strontium, bismuth, and tantalum.

9. An integrated circuit as in claim 7 wherein said layered superlattice material comprises strontium, bismuth, tantalum and niobium in relative molar proportions corresponding to a stoichiometric formula $SrBi_{2.18}Ta_{1.44}Nb_{0.56}O_9$.

10. An integrated circuit comprising:

a thin film of metal oxide material; and a hydrogen barrier layer, said hydrogen barrier layer located to inhibit the diffusion of hydrogen to said thin film of metal oxide material, and said hydrogen barrier layer comprising a nitride of copper.

11. An integrated circuit as in claim 10 wherein said hydrogen barrier layer is located directly over at least a portion of said thin film of metal oxide material.

12. An integrated circuit as in claim 10 wherein said hydrogen barrier layer is located laterally from said thin film of metal oxide material.

13. An integrated circuit as in claim 10 wherein said metal oxide material comprises a nonferroelectric, high-dielectric constant material.

14. An integrated circuit as in claim 10 wherein said metal oxide material comprises a layered superlattice material.

15. An integrated circuit as in claim 10 wherein said metal oxide material comprises a ferroelectric material.

16. An integrated circuit comprising:

a thin film of metal oxide material; and a hydrogen barrier layer, said hydrogen barrier layer located to inhibit the diffusion of hydrogen to said thin film of metal oxide material, and said hydrogen barrier layer comprising a nitride of tungsten.

17. An integrated circuit as in claim 16 wherein said hydrogen barrier layer is located directly over at least a portion of said thin film of metal oxide material.

18. An integrated circuit as in claim 16 wherein said hydrogen barrier layer is located laterally from said thin film of metal oxide material.

19. An integrated circuit as in claim 16 wherein said metal oxide material comprises a nonferroelectric, high-dielectric constant material.

20. An integrated circuit as in claim 16 wherein said metal oxide material comprises a layered superlattice material.

21. An integrated circuit as in claim 16 wherein said metal oxide material comprises a ferroelectric material.

* * * * *